(12) United States Patent
Kato

(10) Patent No.: US 7,104,665 B2
(45) Date of Patent: Sep. 12, 2006

(54) LIGHTING DEVICE AND DISPLAY DEVICE INCORPORATING THE SAME

(75) Inventor: Yoshifumi Kato, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 122 days.

(21) Appl. No.: 10/980,912

(22) Filed: Nov. 3, 2004

(65) Prior Publication Data

US 2005/0111085 A1  May 26, 2005

(30) Foreign Application Priority Data

Nov. 6, 2003  (JP) ............................... 2003-376423

(51) Int. Cl.
*F21V 9/16* (2006.01)
*G02F 1/13357* (2006.01)

(52) U.S. Cl. ............................ 362/84; 362/331; 349/69

(58) Field of Classification Search ................. 362/84, 362/603, 330–331; 349/62–64, 59; 313/504, 313/512
See application file for complete search history.

(56) References Cited

U.S. PATENT DOCUMENTS

| | | | | |
|---|---|---|---|---|
| 6,018,379 A | * | 1/2000 | Mizobata et al. | 349/112 |
| 6,144,429 A | * | 11/2000 | Nakai et al. | 349/113 |
| 6,172,726 B1 | * | 1/2001 | Matsute et al. | 349/113 |
| 2002/0176036 A1 | * | 11/2002 | Kaneko | 349/65 |
| 2003/0107691 A1 | * | 6/2003 | Kaneko et al. | 349/113 |

FOREIGN PATENT DOCUMENTS

| | | |
|---|---|---|
| EP | 0 878 720 | 11/1998 |
| JP | 2002-156633 | 5/2002 |
| WO | 98/17083 | 4/1998 |

* cited by examiner

Primary Examiner—Ali Alavi
(74) Attorney, Agent, or Firm—Morgan & Finnegan, LLP

(57) ABSTRACT

An illuminating device comprises a transparent substrate, an area light emitting device and at least one contact terminal for supplying electric power to the area light emitting device. The area light emitting device comprises a first electrode, a thin film layer having an emission layer and a second electrode formed over the transparent substrate, for emitting light that is transmitted through the transparent substrate. Further, a plurality of light scattering members are provided with the transparent substrate, in a manner such that the density of the scattering members increases commensurate with the distance from said contact terminal.

18 Claims, 3 Drawing Sheets

LIGHTING DEVICE AND DISPLAY DEVICE INCORPORATING THE SAME

BACKGROUND OF THE INVENTION

The present invention relates to a lighting device and a display device incorporating the same.

Display devices that include light emitting devices and a transparent electrode, such as organic electroluminescence devices, generally use indium tin oxide (ITO) or zinc oxide (ZnO) for the transparent electrode.

However, because the above described transparent electrodes do not have sufficiently high conductivity, the resistivity at an area near a contact terminal and that at an area far from the contact terminal is significantly different to result in a varied electric current. The unevenness in the luminance of the light emission between areas is thereby caused since the luminance depends on the amount of electric current supplied from the electrodes.

Therefore, Japanese Laid-Open Patent Publication 2002-156633 provided a liquid crystal display device provided with an auxiliary electrode on the transparent electrode for a method of controlling the unevenness in the luminance.

However, since the liquid crystal display device used a non-transparent material for the auxiliary electrode, the auxiliary electrode needed to be disposed in regions conforming to the pixels of the liquid crystal. Such a limitation hindered the sufficient elimination of the unevenness in the luminance. Further, a precise technique was necessary to accurately arrange the auxiliary electrode to conform to the pixels. The difficulty in the process caused decrease of the yield.

BRIEF SUMMARY OF THE INVENTION

An object of the invention is to provide a lighting device which can achieve evenness in the luminance without using auxiliary electrodes, and a display device incorporating the same.

In order to achieve the above, an lighting device comprises a transparent substrate, an area light emitting device and at least one contact terminal for supplying electric power to the area light emitting device. The area light emitting device comprises a first electrode, a thin film layer having an emission layer and a second electrode formed over the transparent substrate, for emitting light that is transmitted through the transparent substrate. Further, a plurality of light scattering members are provided with the transparent substrate, in a such manner that the density of the scattering members increases commensurate with the distance from said contact terminal.

According to a preferred embodiment, an area lighting device comprises a transparent substrate, an area light emitting element formed over the transparent substrate and a contact terminal. The area lighting device emits light through the transparent substrate.

The area light emitting element comprises a first electrode which is transparent, a thin film layer which includes an emission layer, and a second electrode. The transparent substrate is provided with light scattering members in a manner to be denser commensurate with the distance from the contact terminal. Since the light scattering members are arranged to be denser as the area is further from the contact terminal, the substantive portion of the light enters the transparent substrate at angles no less than the critical angle and is subjected to total reflection on the light emitting surface, in the areas that are near the contact terminal. The light is then guided through the transparent substrate.

On the other hand, in areas that are far from the contact terminal, the substantive portion of the light is incident on the transparent substrate at angles no less than the critical angle and reaches the light scattering members. The optical path is then altered (scattered) so that the incident angle on the light emitting surface is smaller than the critical angle to allow the light to exit through the light emitting surface.

Note that a portion of the light that entered into the transparent substrate at angles no less than the critical angle and is then deflected by the light scattering members to also have angles no less than the critical angle can be subjected to total reflection at the light emitting surface. However, the optical path of the deflected light can then be altered again to have a smaller angle than the critical angle because the light is deflected by the light scattering member again, in the case where it is guided through the transparent substrate by way of reflections on the side face, incident surface and the light emitting surface of the transparent substrate, or in the case where the light reenters into the light emitting element and returns to the transparent substrate to be guided through the transparent substrate. In this way, the light can exit from the light emitting surface.

Accordingly, while the luminance is high in areas near the contact terminal, the light extraction efficiency is low compared to the areas that are farther from the contact terminal because the density of light scattering members is less. On the other hand, while the luminance is low in the areas far from the contact terminal, the light extraction efficiency is higher compared to the areas near the contact terminal due to the comparatively denser light scattering members.

As a result, uneven luminance can be suppressed without using auxiliary electrodes. Here, "near the contact terminal" denotes that the shortest distance to the contact terminal is small, and "far from the contact terminal" denotes that the shortest distance to the contact terminal is long.

In one embodiment of the invention, the light scattering members are disposed within the transparent substrate.

In another embodiment, the light scattering members are portions having convex or concave portions disposed on the transparent substrate. In this embodiment, the light extraction efficiency can be changed depending on the convexities or concavities disposed on the light emitting surface so that the uneven luminance can be suppressed without using auxiliary electrodes. Note that the timing for forming the light scattering members on the transparent substrate can either be before or after forming the organic EL devices on the transparent substrate. Accordingly, if the light scattering members are provided after forming the light emitting element, the shape of the light scattering members can be designed or the positions where the light scattering members are formed can be adjusted in conformance with the light emitting or light extraction properties of the light emitting element or the lighting device.

In one embodiment of the invention, the area light emitting element is an organic electroluminescent device.

In one embodiment of the invention, the area lighting device can be used for backlighting a transmissive or semi-transmissive image display panel. In this embodiment, the uneven luminance can be suppressed compared to the display devices using conventional lighting devices. The image display panel can be a liquid crystal display panel.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the invention, in which the area lighting device of the invention is used for backlighting a passive transmissive type liquid crystal display device is described below with reference to FIGS. 1–4.

Figure 1:
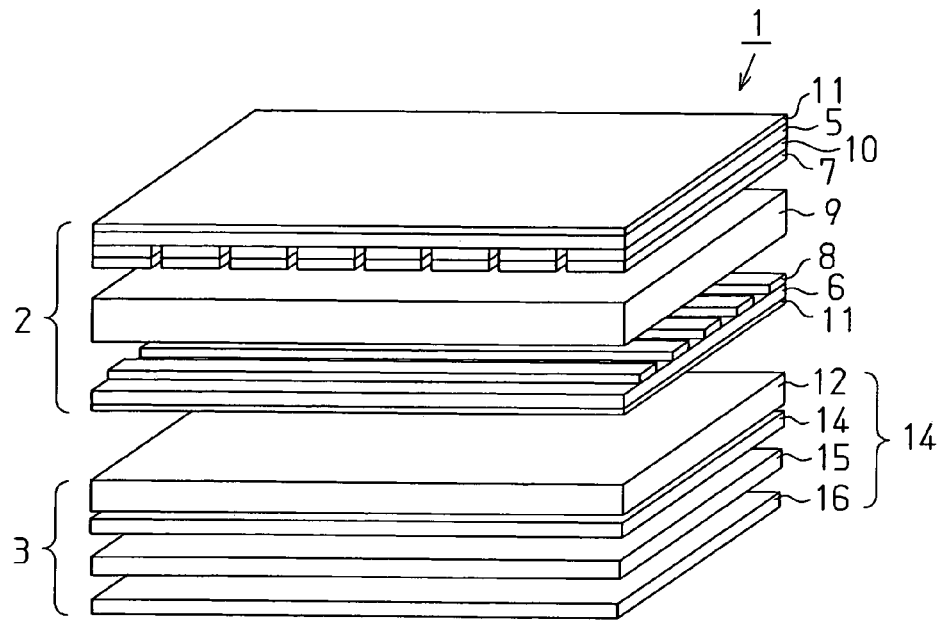
FIG. 1 is a perspective view showing a transmissive type liquid crystal display device according to an embodiment.

Referring to FIG. 1, the transmissive type liquid crystal display device 1 comprises a liquid crystal panel 2 used for a transmissive type image display panel and an organic electroluminescent lighting device 3 used as an lighting device.

The passive matrix liquid crystal panel 2 can be any of conventionally known types, comprising a first transparent substrate 5, a second transparent substrate 6 and a liquid crystal layer 9 held between the first transparent substrate 5 and the second transparent substrate 6.

Polarizer plates 11 are disposed on the outer surface of the first and second transparent substrates 5 and 6.

A plurality of color filters 10 are disposed in parallel stripes on a surface of the first transparent substrate 5, which contacts the liquid crystal layer 9. ITO electrodes 7 are formed in a similar manner and in parallel to, the color filters 10.

A plurality of striped opposing electrodes 8 are formed in parallel on a surface of the second transparent substrate 6 contacting the liquid crystal layer 9 to be orthogonal to the striped color filters 10 and the ITO electrodes 7.

Liquid crystal 9 is then placed between the ITO electrodes 7 and the opposing electrodes 8. The first transparent substrate 5 and the second transparent substrate 6 are sealed through a sealant not shown in the figures in a state in which the distance between the substrates are held uniform. Accordingly, the ITO electrodes 7 and the opposing electrodes 8 form pixels at the intersecting portions where the electrodes overlap by interposing the liquid crystal 9. The pixels are arranged in a matrix.

As shown in FIG. 3, the organic electroluminescent lighting device 3 comprises the transparent substrate 12, the organic electroluminescent device 4 used as the area light emitting element and the contact terminal portion 100.

The transparent substrate 12 can be formed from any material so long as the substrate can be transmissive to at least a portion of visible rays and can configure the light scattering member 13. For example, a glass substrate, a transparent resin substrate or a transparent and flexible substrate made of resin can be used. In the first embodiment, a glass substrate is used.

Figure 2:
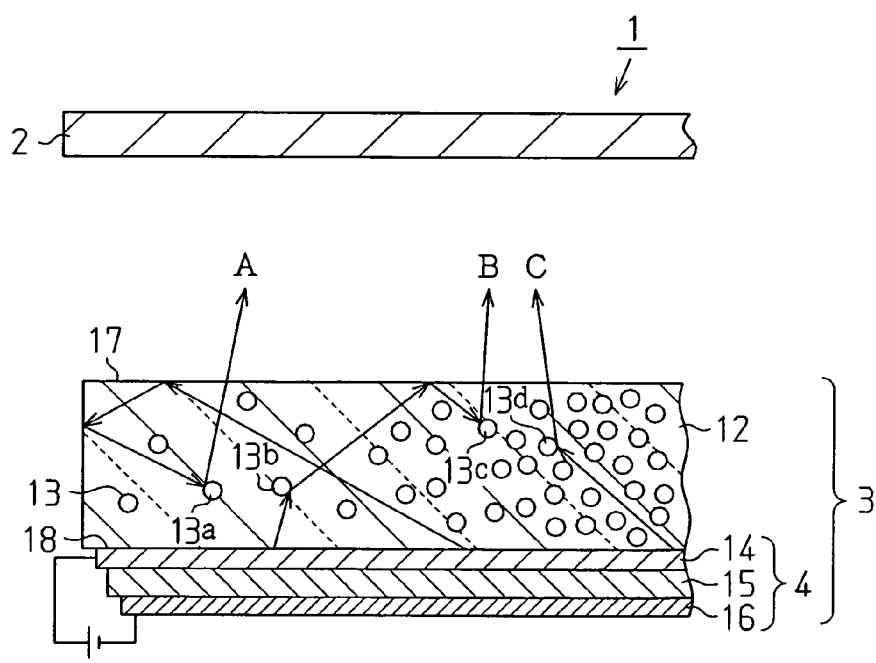
FIG. 2 is a schematic cross section showing the optical path in the transmissive type liquid crystal display device according to one embodiment of the invention.

As shown in FIG. 2, the transparent substrate 12 includes the light emitting surface 17 and the incident surface 18 opposite to the light emitting surface 17.

Figure 3A:
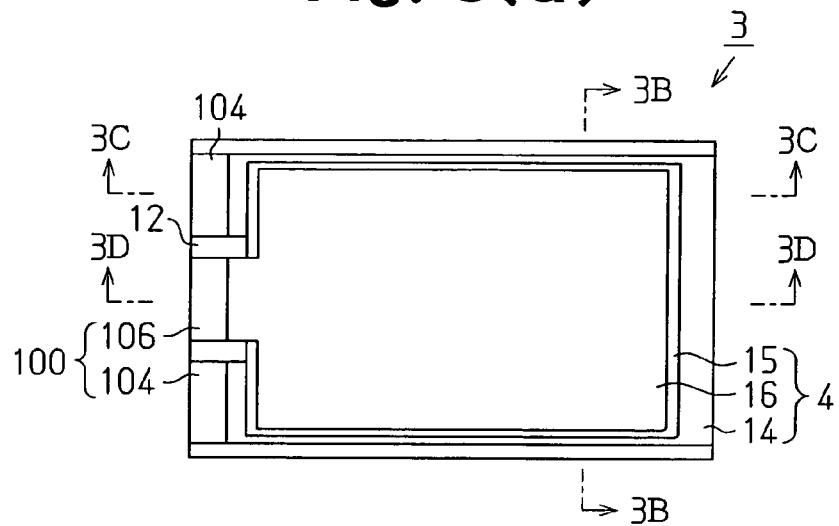
FIG. 3(a) is a schematic top view of an organic electroluminescent lighting device according to one embodiment of the invention.
Figure 3B:
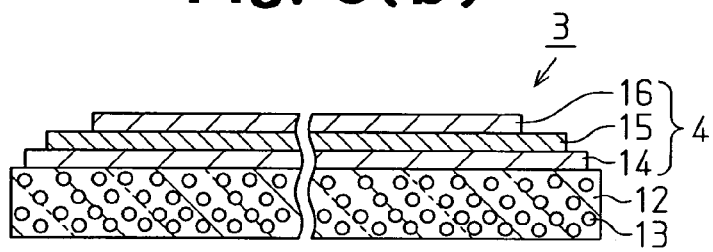
FIG. 3(b) is a schematic cross sectional view taken along line 3B—3B of FIG. 3(a)
Figure 3C:
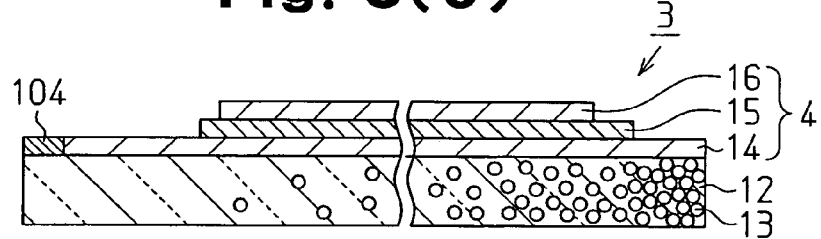
FIG. 3(c) is a schematic cross sectional view taken along line 3C—3C of FIG. 3(a)
Figure 3D:
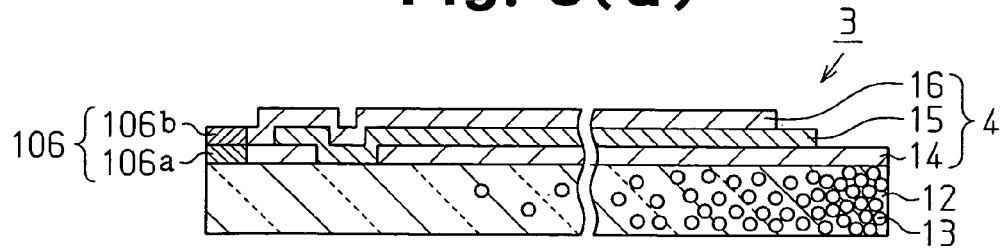
FIG. 3(d) is a schematic cross sectional view taken along line 3D—3D of FIG. 3(a)

The light scattering members 13 for scattering the light are disposed as shown in FIGS. 3(c) and 3(d), in a non-dense manner in the areas near the contact terminal 104 of a cathode and the contact terminal 106 of an anode (left hand side of the FIGS. 3(c) and 3(d)). The light scattering members 13 are disposed in a dense manner in the areas far from the contact terminal 104 of the cathode and the contact terminal 106 of the anode (right hand side of the FIGS. 3(c) and 3(d)). In other words, the light scattering members 13 are arranged to be denser as the distance of the area from the contact terminal 100 increases.

Note that the term "scatter" includes both reflection and refraction in the present invention.

The light scattering members 13 can be any shape so long as they can change the optical path of the light which reaches the light scattering members 13. In the first embodiment, sphere resin beads having a different refraction index from glass are provided within the glass substrate 12.

The organic electroluminescent device 4 is formed by laminating the first electrode 14, an organic thin film layer 15 used as the thin film layer and the second electrode 16, in this order from the substrate 12.

Metals having a large work function (no less than 4 eV), alloys, conductive compounds and mixtures thereof can be preferably used for the first electrode 14. Examples of the electrode materials are metals such as gold (Au) and transparent or semi-transparent materials having conductivity, such as copper iodide (CuI), ITO, tin oxide ($SnO_2$) and zinc oxide (ZnO). The electrode can be manufactured by forming thin films through methods such as vapor deposition and sputtering of these electrode materials.

The organic thin film layer 15 can be either of: a single layer of an emission layer; or a multi-layered structure including at least one of a hole injection layer, a hole transport layer, a hole injection transport layer, a hole blocking layer, an electron injection layer, an electron transport layer and an electron blocking layer, and the emission layer.

The organic thin film layer 15 of the first embodiment is a multi layer structure in which the hole injection layer, the hole transport layer, the emission layer, the electron transport layer and the electro injection layer are laminated. In order to emit white light in the emission layer of the organic thin film layer 15, a red light emission layer, a green light emission layer and a blue light emission layer are laminated.

For the electrode material of the second electrode 16, metals having a small work function (less than 4 eV), alloys, conductive compounds and mixtures thereof can be used. Examples of such electrode materials include sodium, sodium-potassium alloy, magnesium, lithium, magnesium/copper mixture, Al/($Al_2O_3$), indium and rare earth metals. The second electrode 16 can be manufactured by forming thin films through methods such as vapor deposition and sputtering of these electrode materials.

Note that the organic electroluminescent lighting device 4 is covered by a protection film formed from silicon nitride (SiN$_x$), though not shown in the figures.

Figure 4A:
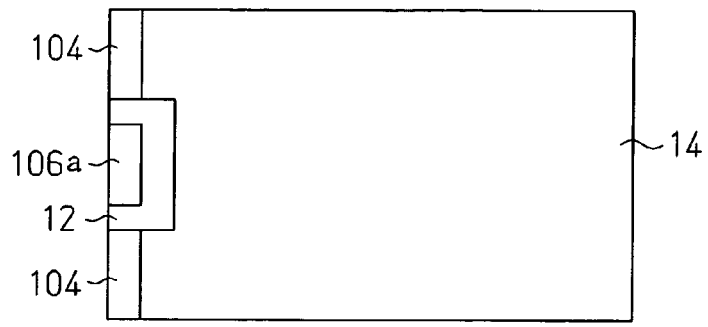
FIG. 4(a) is a schematic view showing the arrangement of a first electrode, a contact terminal and a contact terminal of a second electrode formed over a transparent substrate.

FIG. 4(a) schematically shows the arrangement of the first electrode 14 formed over the transparent substrate 12, the contact terminal 104 and the contact terminal 106a. The first electrode 14 and the contact terminals 104 and 106a are patterned by removing a portion of the first electrode formed over the transparent substrate 12. The contact terminal 104, as shown in FIG. 4(a), is formed successively with the first electrode 14 and the contact terminal 106a is formed separately from the contact terminal 104.

Figure 4B:
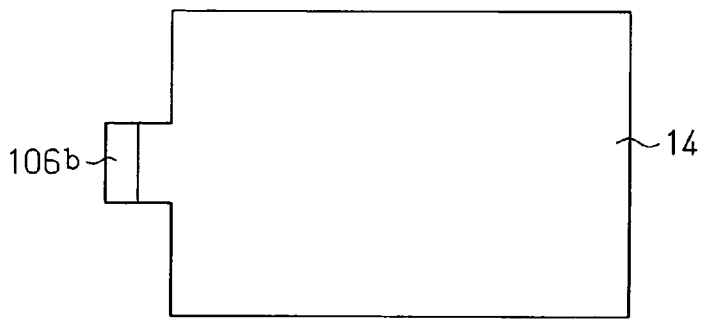
FIG. 4(b) is a schematic view showing the arrangement of a second electrode and a contact terminal.

FIG. 4(b) schematically shows the arrangement of the second electrode 16 and the contact terminal 106b. In order to prevent short circuits between the first electrode 14 and the second electrode 16, the second electrode 16 is formed to have an area smaller than the organic thin film layer 15.

The second electrode 16 is formed so that the contact terminal 106a, which is formed from the same material as the first electrode 14, is associated with the contact terminal 106b. Accordingly, the portion where the contact terminals 106a and 106b overlap forms the contact terminal 106 of the second electrode.

The operation of the transmissive type liquid crystal display device 1 as described above is next described by referring to FIG. 2. When voltage is applied between the electrodes of the organic electroluminescent device 4, white colored light is emitted from the emission layer in the organic thin film layer 15. The majority portion of the light is directed to the transparent substrate 12.

The emission layer of the organic electroluminescent device 4 according to the first embodiment is formed into a planar shape. In other words, the area light emitting device can be treated as equivalent to a light source formed from a group of a plurality of small light emitting regions arranged on a plane. Accordingly, since the light rays emitted from each small light emitting region propagate radially from the each small light emitting region, light enters the incident surface 18 with various directions.

If the transparent substrate 12 of the organic electroluminescent lighting device 3 using an organic electroluminescent device 4 is not provided with the light scattering member 13, the following occurs. The light entering inside the transparent substrate 12 with an angle no less than the critical angle, which is determined by the refractive index of glass and that of air, and when reaching the light emitting surface 17 does not exit the transparent substrate 12 because it is subjected to total reflection of the light emitting surface 17. Although the light is subjected to reflections on the faces of the transparent substrate 12, or the light reenters the organic electroluminescent device 4, the incident angle on the light emitting surface 17 does not change. Therefore, the light will be attenuated within the transparent substrate 12 or within the organic electroluminescent device 4 because the light will never be extracted to the outside after repeated reflections on the light emitting surface 17 and the incident surface 18.

The optical path of the light in the case where the light scattering members 13 are disposed as described above within the transparent substrate 12 is next described.

As shown in FIG. 2, the light emitted from the emission layer enters the transparent substrate 12. Among the light which entered inside the transparent substrate 12, the light which entered the substrate 12 with an angle no less than the critical angle, when reaching the light emitting surface without entering into the light scattering member, is subjected to total reflection at the interface between the transparent substrate 12 and the atmosphere (light emitting surface 17). The substantive portion of the light is guided through the transparent substrate 12.

Among the light which is guided through the transparent substrate 12, the light incident on the light scattering member 13a (the light indicated by arrow A in FIG. 2) is scattered to alter the optical path to have the incident angle on the light emitting surface 17 smaller than the critical angle. The light is then emitted from the light emitting surface 17 toward the liquid crystal panel 2.

Among the light that entered the transparent substrate 12 with an angle no less than the critical angle, there is light that entered the light scattering member 13d (the light indicated by the arrow C in FIG. 2), and is scattered to change the path to have an incident angle on the light emitting surface 17 smaller than the critical angle. The light is then emitted from the light emitting surface 17 toward the liquid crystal panel 2.

Here, as shown in FIG. 3, the organic electroluminescent lighting device 3 according to the first embodiment includes the light scattering members 13 that are arranged to be denser as the distance from the contact terminal 100 is larger. Namely, the majority portion of the light that entered the transparent substrate 12 in the vicinity of the contact terminal 100 with an angle no less than the critical angle is subjected to total reflection on the light emitting surface 17 and is guided through the transparent substrate 12. On the other hand, the majority portion of the light that entered the transparent substrate 12 in a portion far from the contact terminal 100 with an angle no less than the critical angle reaches the light scattering member 13 and the direction is changed so that the incident angle on the light emitting surface 17 is smaller than the critical angle (scattered), and is emitted from the light emitting surface 17 of the transparent substrate 12.

Note that among the light that entered the transparent substrate 12 with an angle no more than the critical angle, the angle of a portion of the light that entered the light scattering member 13b is deflected to have an angle no less than the critical angle, and can be subjected to total reflection at the light emitting surface. However, the optical path of the deflected light can then be altered again to have a smaller angle than the critical angle because the light is deflected by a light scattering member again, in the case where it is guided through the transparent substrate by way of reflections on the side face, the incident surface and the light emitting surface of the transparent substrate, or in the case where the light reenters into the organic EL element and returns to the transparent substrate to be guided through the transparent substrate.

Accordingly, while the organic electroluminescent lighting device 3 according to the first embodiment has a high luminance in the portion proximal to the contact terminal 100, the light extraction efficiency was inferior compared to that of a portion far from the contact terminal 100 because less light scattering members 13 are disposed. On the other hand, while the luminance is low in the portion far from the contact terminal, the light extraction efficiency is superior compared to the portion proximal to the contact terminal 100 because more light scattering members 13 are disposed.

The unevenness in the luminance can therefore be suppressed.

The light emitted from the light emitting surface 17 of the transparent substrate 12 enters the back side (the side opposite to the user) of the liquid crystal panel 2 and the light is transmitted through, or blocked depending on each pixel to be observed as a character or an image as a whole.

In the first embodiment, the light scattering members are disposed within the transparent substrate to be denser in the portions far from the contact terminal. Accordingly, the portions proximal to the contact terminal have high luminance and inferior light extraction efficiency, and the portions far from the contact terminal have low luminance but excellent light extraction efficiency. The unevenness in the luminance can thus be suppressed.

The light scattering members are disposed within the transparent substrate in the first embodiment. Because the light scattering members change the direction of the light to have an incident angle smaller than the critical angle among the light that is subjected to total reflection when the light scattering members are not provided, the light can be extracted from the transparent substrate. Accordingly, compared to the conventional devices that are not provided with light scattering members, the luminance can be enhanced when the same power is used, and electric power consumption can be lowered to achieve the same luminance.

Figure 5:
FIG. 5 is a schematic cross sectional view showing a transmissive type liquid crystal display device according to another embodiment.
Figure 5:
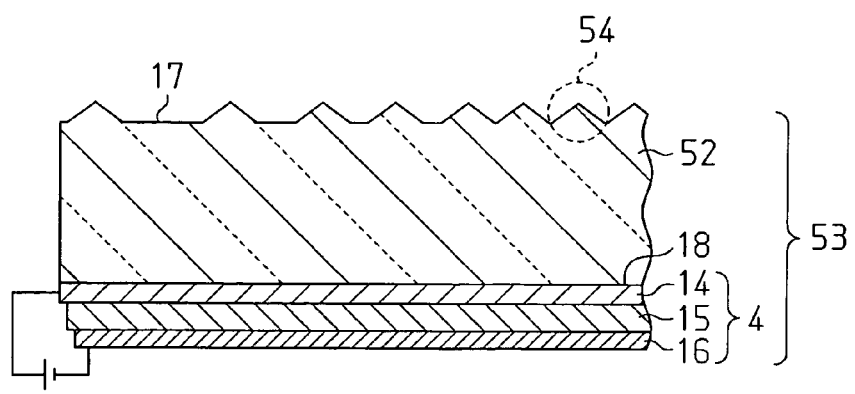

The organic electroluminescent lighting device 53 of a passive matrix transmissive type liquid crystal display device 50 according to a second embodiment includes light scattering members 54 that are convexities or concavities provided on the light emitting surface of the transparent substrate 52, as shown in FIG. 5. Other constitutions are similar to those of the first embodiment.

The second embodiment provides the advantages described above. Also, in the second embodiment the timing for disposing the light scattering members on the transparent substrate can be before or after forming the organic electroluminescent element on the transparent substrate. Accordingly, if the light scattering members are disposed after forming the organic electroluminescent element, the shape of the light scattering members and the place at which the light scattering members are disposed can be designed to conform to the luminance and light extraction properties of the lighting device or the organic electroluminescent element.

It should be apparent to those skilled in the art that the present invention may be embodied in many other specific forms without departing from the spirit or scope of the invention. Particularly, it should be understood that the invention may be embodied in the following forms.

The shape of the light scattering members 13 disposed within the transparent substrate 12 is not limited to spherical. Any shape can be used so long as it can change the direction of the light entering into the light scattering members 13.

The light scattering members 13 disposed within the transparent substrate 12 are not limited to beads. Any form can be used so long as they can change the direction of the light entering into the light scattering members 13.

For example, bubbles of inert gas such as nitrogen gas can be provided, or scratches can be formed to provide a different refractive index from other portions. The scratches within the transparent substrate 12 can be formed, for example by irradiating laser light on to the bulk of the transparent substrate 12.

The first electrode 14 that is disposed on the transparent substrate side can be used as a cathode and the second electrode 16 can be used as an anode. In this case, the structure of the organic thin film layer 15 can also be changed to conform to the change in the electrodes. For example, the organic thin film layer 15 can be a three-layered structure of an electron injection layer, emission layer and hole injection layer, or a five-layered structure comprising an electron injection layer, electron transport layer, emission layer, hole transport layer and hole injection layer.

The use of the organic electroluminescent lighting device is not limited to backlighting, but it can also be used as another lighting device or display devices.

In the case where the organic electroluminescent lighting device is a passive matrix display device, the first electrode 14 is, for example, formed into a plurality of parallel stripes on a surface of the transparent substrate 12. The organic thin film layer 15 is formed into a plurality of parallel stripes that extend in a direction perpendicular to the first electrode 14 in a state where the organic thin film layer 15 is separated by an insulative partition wall not shown in the figures. The second electrode 16 is laminated on the organic thin film layer 15. The pixels of the display device (pixels or subpixels) are arranged in a matrix over the transparent substrate 12 at the sections where the first electrode 14 and the second electrode 16 cross.

The position of the contact terminal 106 of the second electrode 16 is not necessarily on the same side edge of the transparent substrate on which the contact terminal 104 of the first electrode 14 is disposed. The contact terminal 106 can be disposed on a side adjacent to the side on which the contact terminal 104 is disposed, or the side that is opposite to the side where the contact terminal 104 is disposed.

When the organic electroluminescent lighting device is used as a display device, a color filter may be disposed on the transparent substrate.

The second electrode 16 may not have reflectivity with respect to visible rays. However, the light intensity emitting from the transparent substrate 12 can be increased in the case of using reflection compared to the aspect which does not use reflected light of the second electrode 16 because the light directing the second electrode 16 from the organic thin film layer 15 is reflected on the second electrode 16 and is emitted from the transparent substrate 12 side. Accordingly, necessary light intensity can be obtained even if the light intensity of the organic thin film layer 15 is reduced so that the consumption power can be reduced.

The organic thin film layer 15 can be a black and white display or a monochrome display. That is, when forming the organic thin film layer 15, the organic thin film layer 15 need not include all colors of red, blue and green for the fluorescent dyes. The organic thin film layer 15 can only emit single colored light. In this case, the liquid crystal display device 1 is a black and white display or a monochrome display.

The liquid crystal panel 2 is not limited to a passive matrix and an active matrix driving can also be used. In addition, the display type is not limited to a transmissive type but a semi-transmissive type can also be used.

The image display panel is not limited to a liquid crystal panel as long as it can display an image through transmission of light, for example, a PLZT can be used.

The lighting device can be used in any other lighting devices than those for backlighting. In these cases, the lighting device can be formed with organic electroluminescent lighting devices 15 on both sides of the transparent substrate 12. Further, in the case of using lighting devices other than for backlighting, the transparent substrate is not limited to a planar shape but can be a semi-spherical or columnar shape, or can have a curved surface such as an arcuate shape.

An inorganic electroluminescent device can be used for the area light emitting device in place of the organic electroluminescent element. In this case, while the applied voltage during light emission can be higher than that of the organic electroluminescent element, the light intensity of the light that is emitted from the light emitting surface can be increased by controlling the light that enters the transparent substrate from the light emitting device and which exits from the side face of the transparent substrate.

The first electrode 20 can also be formed transparent by using an extra thin metal layer in place of using a transparent material having conductivity. The term "extra thin" denotes a thickness of no more than 50 nm, and the preferable range is between 0.5 nm and 20 nm.

The material for the protection film is not limited to silicon nitride. Other materials having low transmissivity or gases such as moisture and oxygen, for example, silicon oxide ($SiO_x$) or diamond-like-carbon can be used. Further, the protection film can be formed by laminating thin films of different materials.

The protection film can be formed from a moisture-proof layer in place of using silicon nitride.

An insulating layer can be disposed between the first electrode 14 and the second electrode 16. In this case, the short circuit between the first electrode 14 and the second electrode 16 can be securely prevented.

The organic electroluminescence elements can produce white light.

The area of the organic electroluminescence layer can be formed larger than that of the second electrode.

Therefore, the present examples and embodiments are to be considered as illustrative and not restrictive and the invention is not to be limited to the details given herein, but may be modified within the scope and equivalence of the appended claims.

The invention claimed is:

1. An lighting device comprising:
   a transparent substrate;
   an area light emitting device including a first electrode, a thin film layer having an emission layer and a second electrode formed over the transparent substrate, for emitting light which is transmitted through the transparent substrate;
   at least one contact terminal for supplying electric power to the area light emitting device; and
   a plurality of light scattering members provided with the transparent substrate, in a manner that the density of the scattering members increases commensurate with the distance from said contact terminal.

2. The lighting device according to claim 1, wherein the light scattering members are disposed within the transparent substrate.

3. The lighting device according to claim 2 wherein the light scattering members are beads dispersed within the transparent substrate.

4. The lighting device according to claim 2 wherein the shape of the light scattering members is spherical.

5. The lighting device according to claim 2 wherein the area light emitting device is an organic electroluminescent lighting device.

6. The lighting device according to claim 1 wherein the light scattering members are convexities or concavities formed on the transparent substrate.

7. The lighting device according to claim 6 wherein the area light emitting device is an organic electroluminescent lighting device.

8. A display device comprising:
   an image display panel for displaying an image through switching of each pixel to transmit light therethrough and an lighting device for emitting said light toward the image display panel, said lighting device including:
   a transparent substrate;
   an area light emitting device comprising a first electrode, a thin film layer having an emission layer and a second electrode formed over the transparent substrate, for emitting light which is transmitted through the transparent substrate;
   at least one contact terminal for supplying electric power to the area light emitting device; and
   a plurality of light scattering members are provided with the transparent substrate, in a manner that the density of the scattering members increases commensurate with the distance from said contact terminal.

9. The display device according to claim 8 wherein the light scattering members are disposed within the transparent substrate.

10. The display device according to claim 9 wherein the light scattering members are beads dispersed within the transparent substrate.

11. The display device according to claim 9 wherein the shape of the light scattering members is spherical.

12. The display device according to claim 9 wherein the area light emitting device is an organic electroluminescent lighting device.

13. The display device according to claim 8 wherein the light scattering members are convexities or concavities formed on the transparent substrate.

14. The lighting device according to claim 13 wherein the area light emitting device is an organic electroluminescent lighting device.

15. The display device according to claim 8 wherein said image display panel comprises a liquid crystal display panel.

16. The display device according to claim 8 wherein said image display panel is a passive matrix display panel.

17. The display device according to claim 8 wherein said image display panel is an active matrix display panel.

18. The display device according to claim 8 wherein the light scattering members are at least one of convexities or concavities formed on the transparent substrate.

* * * * *